US012660385B2

(12) United States Patent
Niwa et al.

(10) Patent No.: US 12,660,385 B2
(45) Date of Patent: Jun. 16, 2026

(54) SEMICONDUCTOR LIGHT-EMITTING ELEMENT AND METHOD FOR MANUFACTURING SEMICONDUCTOR LIGHT-EMITTING ELEMENT

(71) Applicant: NIKKISO CO., LTD., Tokyo (JP)

(72) Inventors: Noritaka Niwa, Hakusan (JP); Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 723 days.

(21) Appl. No.: 17/981,871

(22) Filed: Nov. 7, 2022

(65) Prior Publication Data

US 2023/0155081 A1 May 18, 2023

(30) Foreign Application Priority Data

Nov. 12, 2021 (JP) ................................. 2021-184804

(51) Int. Cl.
| | |
|---|---|
| *H10H 20/01* | (2025.01) |
| *H10H 20/84* | (2025.01) |
| *H10H 20/854* | (2025.01) |
| *H10H 20/825* | (2025.01) |

(52) U.S. Cl.
CPC .... *H10H 20/854* (2025.01); *H10H 20/01335* (2025.01); *H10H 20/84* (2025.01); *H10H 20/034* (2025.01); *H10H 20/0362* (2025.01); *H10H 20/825* (2025.01)

(58) Field of Classification Search
CPC ................. H10H 20/854; H10H 20/84; H10H 20/01335; H10H 20/034; H10H 20/0362; H10H 20/825
See application file for complete search history.

(56) References Cited

U.S. PATENT DOCUMENTS

| | | | | |
|---|---|---|---|---|
| 9,178,116 | B2 * | 11/2015 | Hodota | ................ H10H 20/833 |
| 2005/0211989 | A1 * | 9/2005 | Horio | ................... H10H 20/832 |
| | | | | 257/E33.068 |
| 2005/0286597 | A1 * | 12/2005 | Mukoyama | ......... H01S 5/02253 |
| | | | | 372/50.23 |

(Continued)

FOREIGN PATENT DOCUMENTS

| | | |
|---|---|---|
| JP | 2016171141 A | 9/2016 |
| TW | 201212290 A | 3/2012 |

*Primary Examiner* — Jeff W Natalini
*Assistant Examiner* — Andrew John Zabel
(74) *Attorney, Agent, or Firm* — MUNCY, GEISSLER, OLDS & LOWE, P.C.

(57) ABSTRACT

A semiconductor light-emitting element has an n-type semiconductor layer arranged on a base layer, and is made of an n-type AlGaN-based semiconductor material; an active layer arranged on the n-type semiconductor layer, and is made of an AlGaN-based semiconductor material; a p-type semiconductor layer arranged on the active layer; a p-side contact electrode that contacts the top face of the p-type semiconductor layer; a dielectric protective layer that covers the p-side contact electrode, contacts the top face of the p-type semiconductor layer, and is made of $SiO_2$; and a dielectric cover layer that contacts the individual side faces of the active layer and the p-type semiconductor layer, contacts the top face of the p-type semiconductor layer, covers the dielectric protective layer, and is made of $Al_2O_3$.

1 Claim, 7 Drawing Sheets

(56)                     References Cited

U.S. PATENT DOCUMENTS

| | | | |
|---|---|---|---|
| 2009/0179215 A1* | 7/2009 | Matsui | H10H 20/832 |
| | | | 257/E21.294 |
| 2016/0315225 A1* | 10/2016 | Kageyama | H10H 20/831 |
| 2018/0277714 A1* | 9/2018 | Furusawa | H10H 20/01335 |
| 2020/0052158 A1 | 2/2020 | Bour et al. | |
| 2020/0220046 A1* | 7/2020 | Inazu | H10H 20/831 |
| 2020/0295232 A1* | 9/2020 | Chae | H10H 20/8506 |
| 2020/0335664 A1* | 10/2020 | Niwa | H10H 20/01335 |
| 2021/0336089 A1 | 10/2021 | Wu et al. | |

* cited by examiner

SEMICONDUCTOR LIGHT-EMITTING ELEMENT AND METHOD FOR MANUFACTURING SEMICONDUCTOR LIGHT-EMITTING ELEMENT

RELATED APPLICATION

Priority is claimed to Japanese Patent Application No. 2021-184804, filed on Nov. 12, 2021, the entire content of which is incorporated herein by reference.

BACKGROUND OF THE INVENTION

1. Field of the Invention

The present disclosure relates to a semiconductor light-emitting element, and a method for manufacturing a semiconductor light-emitting element.

2. Description of the Related Art

Semiconductor light-emitting element has an n-type semiconductor layer, an active layer, and a p-type semiconductor layer, which are stacked on a substrate. The n-type semiconductor layer, the active layer, and the p-type semiconductor layer have inclined side faces. The inclined side faces are covered with a protective film made of $SiO_2$ (see, JP 2016-171141A, for example).

Si contained in the protective film, if diffused into the active layer or the p-type semiconductor layer, would degrade reliability of the active layer or the p-type semiconductor layer.

SUMMARY OF THE INVENTION

Aimed at addressing the aforementioned issue, it is therefore an object of the present invention to provide a semiconductor light-emitting element whose reliability can be kept sufficient, and a method for manufacturing such semiconductor light-emitting element.

A semiconductor light-emitting element according to an aspect of this invention has: an n-type semiconductor layer arranged on a base layer, and is made of an n-type AlGaN-based semiconductor material; an active layer arranged on the n-type semiconductor layer, and is made of an AlGaN-based semiconductor material; a p-type semiconductor layer arranged on the active layer; a p-side contact electrode that contacts the top face of the p-type semiconductor layer; a dielectric protective layer that covers the p-side contact electrode, contacts the top face of the p-type semiconductor layer, and is made of $SiO_2$; and a dielectric cover layer that contacts the individual side faces of the active layer and the p-type semiconductor layer, contacts the top face of the p-type semiconductor layer, covers the dielectric protective layer, and is made of $Al_2O_3$.

Another aspect of the present invention relates to a method for manufacturing a semiconductor light-emitting element. The method includes: forming an n-type semiconductor layer made of an n-type AlGaN-based semiconductor material, an active layer made of an AlGaN-based semiconductor material, and a p-type semiconductor layer, on a base layer sequentially; removing the active layer and the p-type semiconductor layer partially, to expose the n-type semiconductor layer; forming a p-side contact electrode in contact with a top face of the p-type semiconductor layer; forming a dielectric protective layer made of $SiO_2$, so as to cover the p-side contact electrode, in contact with a top face of the p-type semiconductor layer, and in contact with the individual side faces of the active layer and the p-type semiconductor layer; forming, on the dielectric protective layer, a mask in a region that entirely overlaps the p-side contact electrode; removing, by wet etching, the dielectric protective layer in a region not overlapped with the mask, to expose the individual side faces of the active layer and the p-type semiconductor layer; and forming a dielectric cover layer made of $Al_2O_3$, so as to cover the dielectric protective layer, and in contact with the individual side faces of the active layer and the p-type semiconductor layer.

DETAILED DESCRIPTION OF THE INVENTION

Figure 1:
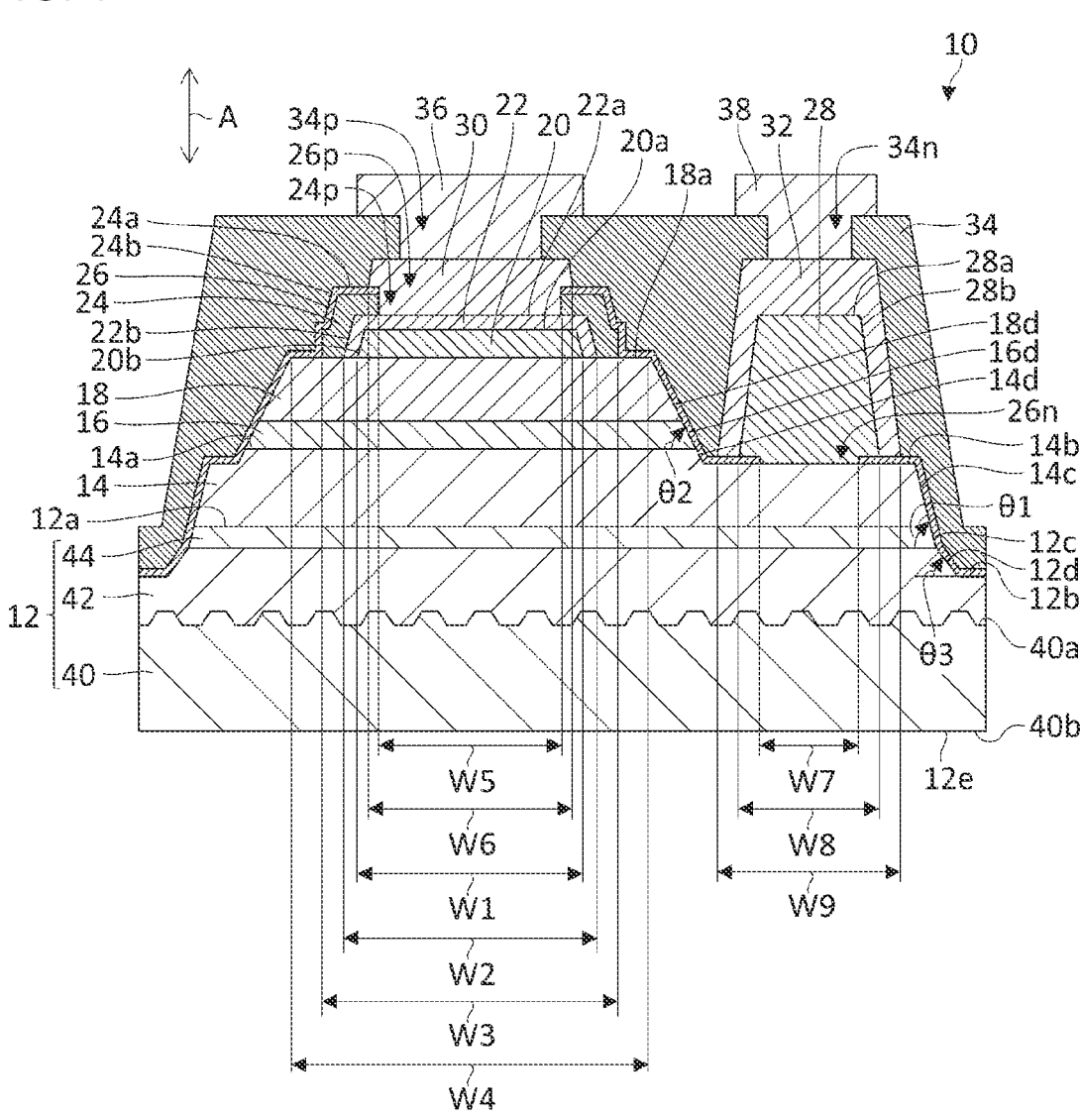
FIG. 1 is a cross sectional view schematically illustrating a structure of a semiconductor light-emitting element according to an embodiment.

The invention will now be described by reference to the preferred embodiments. This does not intend to limit the scope of the present invention, but to exemplify the invention.

Preferred embodiments for carrying out the present invention will be detailed below, referring to the attached drawings. Note that all similar elements in the description will be given similar reference signs, to appropriately avoid redundant explanations. Also note that, for easy understanding, the proportion of the individual constituents in the drawings do not always mirror actual proportion of the light-emitting element.

The semiconductor light-emitting element according to this embodiment is structured to emit "deep ultraviolet radiation" with a center wavelength A of approximately 360 nm or shorter, and is a so-called deep ultraviolet light-emitting diode (DUV-LED) chip. Expecting output of deep UV of this wavelength range, an aluminum gallium nitride (AlGaN)-based semiconductor material having a band gap of approximately 3.4 eV or larger is used. This embodiment will particularly deal with a case of emitting deep UV with a center wavelength $\lambda$ of approximately 240 nm to 320 nm.

In this specification, the "AlGaN-based semiconductor material" refers to a semiconductor material that contains at least aluminum nitride (AlN) and gallium nitride (GaN), and may encompass a semiconductor material containing other materials such as indium nitride (InN). Hence, the "AlGaN-based semiconductor materials" as recited in this specification may be represented by a composition $In_{1-x-y}Al_xGa_yN$ ($0<x+y\leq1$, $0<x<1$, $0<y<1$), and encompasses AlGaN or InAlGaN. The "AlGaN-based semiconductor material" in this specification has a proportion of 1% or larger for both of AlN and GaN, which is preferably 5% or larger, 10% or larger, or 20% or larger.

The term "GaN-based semiconductor materials" may be used occasionally, in order to discriminate any AlN-free material. The "GaN-based semiconductor materials" encompass GaN and InGaN. Similarly, the term "AlN-based semiconductor materials" may be used occasionally, in order to discriminate any GaN-free material. The "AlN-based semiconductor materials" encompass AlN and InAlN.

FIG. 1 is a cross sectional view schematically illustrating a structure of a semiconductor light-emitting element 10 according to the embodiment. The semiconductor light-emitting element 10 has a base layer 12, an n-type semiconductor layer 14, an active layer 16, a p-type semiconductor layer 18, a p-side contact electrode 20, a p-side cover electrode layer 22, a dielectric protective layer 24, a dielectric cover layer 26, an n-side contact electrode 28, a p-side current diffusion layer 30, an n-side current diffusion layer 32, a dielectric sealing layer 34, a p-side pad electrode 36, and an n-side pad electrode 38. The base layer 12 has a substrate 40, a first buffer layer 42, and a second buffer layer 44.

Referring to FIG. 1, the direction indicated by arrow A will occasionally be referred to as "vertical direction" or "thickness direction". Also note that, when viewed from the base layer 12 (or the substrate 40), the direction away from the base layer 12 (or the substrate 40) will occasionally be referred to as the upper side, and the direction towards the base layer 12 (or the substrate 40) will occasionally be referred to as the lower side.

The substrate 40 is made of a material that is transparent to the deep UV light emitted from the semiconductor light-emitting element 10, and is typically made of sapphire ($Al_2O_3$). The substrate 40 has a first principal face 40a, and a second principal face 40b opposite to the first principal face 40a. The first principal face 40a is a crystal growth face on which the individual layers from the first buffer layer 42 to the p-type semiconductor layer 18 are grown. The first principal face 40a has, formed on the surface thereof, a fine texture pattern with submicron (1 $\mu$m or smaller) depth and pitch. This sort of substrate 40 is also referred to as a patterned sapphire substrate (PSS). The first principal face 40a may alternatively be constituted by an unpatterned plain face. The second principal face 40b is a light extraction face 12e through which the deep UV light emitted from the active layer 16 is extracted to the outside.

The first buffer layer 42 is arranged on the first principal face 40a of the substrate 40. The first buffer layer 42 is an underlying layer (template layer) on which the second buffer layer 44 is formed. The first buffer layer 42 is typically an undoped AlN layer, and is, specifically, an AlN (HT-AlN; High Temperature AlN) layer grown at high temperatures. The first buffer layer 42 may alternatively be an undoped AlGaN layer, or may be an AlGaN layer having an AlN proportion larger than that in the second buffer layer 44. The first buffer layer 42 has a thickness of 1 $\mu$m or larger and 3 $\mu$m or smaller, and typically has a thickness of approximately 2 $\mu$m.

The second buffer layer 44 is arranged on the first buffer layer 42. The second buffer layer 44 is made of an undoped AlGaN-based semiconductor material, and is typically an AlGaN layer having an AlN proportion smaller than that of the first buffer layer 42. The AlN proportion of the second buffer layer 44 is typically equal to the AlN proportion of the n-type semiconductor layer 14. The AlN proportion of the second buffer layer 44 may alternatively be larger than the AlN proportion of the n-type semiconductor layer 14. The second buffer layer 44 has a thickness of 20 nm or larger and 200 nm or smaller, and typically has a thickness of approximately 100 nm.

The second buffer layer 44 is structured to be substantially free of n-type impurity such as silicon (Si). Si concentration of the second buffer layer 44 is typically $5\times10^{17}$ cm$^{-3}$ or less. The second buffer layer 44 has the n-type impurity concentration lower than that of the n-type semiconductor layer 14, and therefore has low conductivity (that is, high resistivity). The second buffer layer 44 does not contribute to conduction, when electron is injected from the n-side contact electrode 28 into the active layer 16.

The base layer 12 has a first top face 12a, a second top face 12b, a side face (or inclined face) 12c inclined at a first angle $\theta1$, a side face (or inclined face) 12d inclined at a third angle $\theta3$, and a light extraction face 12e. The first top face 12a is a part where the n-type semiconductor layer 14 is arranged, and is typically the top face of the second buffer layer 44. The second top face 12b is located outside the first top face 12a, and is arranged along the outer circumference of the base layer 12. The second top face 12b is a part where the n-type semiconductor layer 14 is not arranged, and is typically provided to the first buffer layer 42. The side face 12c inclined at the first angle $\theta1$ is provided to the second buffer layer 44. The first angle $\theta1$ is larger than 40 degrees (that is, excluding 40 degrees), and 70 degrees or smaller. The side face 12d inclined at the third angle $\theta3$ is provided to the first buffer layer 42. The third angle $\theta3$ is smaller than the first angle $\theta1$, and measures 40 degrees or smaller.

The n-type semiconductor layer 14 is arranged on the first top face 12a of the base layer 12. The n-type semiconductor layer 14 is made of an n-type AlGaN-based semiconductor material, typically doped with Si as an n-type impurity. The AlN proportion of the n-type semiconductor layer 14 is typically 25% or larger, preferably 40% or larger, or 50% or larger. The AlN proportion of the n-type semiconductor layer 14 is typically 80% or smaller, and preferably 70% or smaller. The n-type semiconductor layer 14 has a thickness or 1 $\mu$m or larger, and 3 $\mu$m or smaller, and typically has a thickness of approximately 2 $\mu$m. The Si concentration of the n-type semiconductor layer 14 is $1\times10^{18}$/cm$^3$ or more and $5\times10^{19}$/cm$^3$ or less. The Si concentration of the n-type semiconductor layer 14 is preferably $5\times10^{18}$/cm$^3$ or more and $3\times10^{19}$/cm$^3$ or less, and more preferably $7\times10^{18}$/cm$^3$ or more and $2\times10^{19}$/cm$^3$ or less.

The n-type semiconductor layer 14 has a first top face 14a and a second top face 14b. The first top face 14a is a part on which the active layer 16 is formed, meanwhile the second top face 14b is a part on which the active layer 16 is not formed. The n-type semiconductor layer 14 has a side face (or inclined face) 14c inclined at a first angle $\theta1$, and a side face (or inclined face) 14d inclined at a second angle $\theta2$. The side face 14c inclined at the first angle $\theta1$ is positioned below the second top face 14b. The side face 14d inclined at the second angle θ2 is positioned above the second top face 14b. The second angle θ2 is smaller than the first angle θ1, and measures 40 degrees or smaller.

The active layer 16 is arranged on the first top face 14a of the n-type semiconductor layer 14. The active layer 16 is made of an AlGaN-based semiconductor material, forming a double heterostructure while being sandwiched between the n-type semiconductor layer 14 and the p-type semiconductor layer 18. The active layer 16 has an AlN proportion controlled so as to output deep UV light with a wavelength of 355 nm or shorter, and typically 320 nm or shorter. The active layer 16 has a side face (or inclined face) 16d inclined at the second angle θ2.

The active layer 16 typically has a single- or multilayered quantum well structure, and contains a barrier layer made of an undoped AlGaN-based semiconductor material, and a well layer made of an undoped AlGaN-based semiconductor material. The active layer 16 typically contains a first barrier layer directly in contact with the n-type semiconductor layer 14, and a first well layer arranged on the first barrier layer. One or more pairs of the barrier layer and the well layer may be additionally provided between the first well layer and the p-type semiconductor layer 18. Each of the barrier layer and the well layer has a thickness of 1 nm or larger and 20 nm or smaller, and typically has a thickness of 2 nm or larger and 10 nm or smaller.

An electron blocking layer may further be provided between the active layer 16 and the p-type semiconductor layer 18. The electron blocking layer is made of an undoped AlGaN-based semiconductor material. The AlN proportion of the electron blocking layer is 40% or larger, and preferably 50% or larger. The AlN proportion of the electron blocking layer may even be 80% or larger. The electron blocking layer may alternatively be made of an AlN-based semiconductor material free of GaN, and may be made of an AlN layer. The electron blocking layer has a thickness 1 nm or larger and 10 nm or smaller, and typically has a thickness of 2 nm or larger and 5 nm or smaller. The electron blocking layer has a side face (or inclined face) inclined at the second angle θ2.

The p-type semiconductor layer 18 is formed on the active layer 16. In a case where the electron blocking layer is provided, the p-type semiconductor layer 18 is formed on the electron blocking layer. The p-type semiconductor layer 18 is made of a p-type AlGaN-based semiconductor material or a p-type GaN-based semiconductor material. The p-type semiconductor layer 18 is an AlGaN layer or a GaN layer, doped with magnesium (Mg) as a p-type impurity. The p-type semiconductor layer 18 typically has a thickness of 20 nm or larger and 400 nm or smaller. The p-type semiconductor layer 18 has a top face 18a, and a side face (or inclined face) 18d inclined at the second angle θ2.

The p-type semiconductor layer 18 may be constituted by a plurality of layers. The p-type semiconductor layer 18 may typically have a p-type cladding layer and a p-type contact layer. The p-type cladding layer is a p-type AlGaN layer having the AlN proportion relatively larger than that of the p-type contact layer, and is in direct contact with the active layer 16 or the electron blocking layer. The p-type contact layer is a p-type AlGaN layer or a p-type GaN layer, having the AlN proportion relatively smaller than that of the p-type cladding layer. The p-type contact layer is arranged on the p-type cladding layer, in direct contact with the p-side contact electrode 20. The p-type cladding layer may have a p-type first cladding layer and a p-type second cladding layer.

The AlN proportion of the p-type first cladding layer is larger than the AlN proportion of the p-side second cladding layer. The AlN proportion of the p-type first cladding layer is equivalent to the AlN proportion of the n-type semiconductor layer 14, or larger than the AlN proportion of the n-type semiconductor layer 14. The AlN proportion of the p-type first cladding layer is 25% or larger, preferably 40% or larger, or 50% or larger. The AlN proportion of the p-type first cladding layer may be 70% or larger, or 80% or larger. The p-type first cladding layer has a thickness of 10 nm or larger and 100 nm or smaller, and typically has a thickness of 15 nm or larger and 70 nm or smaller.

The p-type second cladding layer is arranged on the p-type first cladding layer. The AlN proportion of the p-type second cladding layer is smaller than the AlN proportion of the p-type first cladding layer, and larger than the AlN proportion of the p-type contact layer. The AlN proportion of the p-type second cladding layer is 25% or larger, preferably 40% or larger, or 50% or larger. The AlN proportion of the p-type second cladding layer typically falls within ±10% of the AlN proportion of the n-type semiconductor layer 14. The p-type second cladding layer has a thickness of 5 nm or larger and 250 nm or smaller, and typically has a thickness of 10 nm or larger and 150 nm or smaller. Note that the p-type second cladding layer is omissible, allowing that the p-type cladding layer is solely composed of the p-type first cladding layer.

The p-type contact layer has a relatively small AlN proportion, in view of achieving good ohmic contact with the p-side contact electrode 20. The AlN proportion of the p-type contact layer is 20% or smaller, preferably 10% or smaller, 5% or smaller, or 0%. The p-type contact layer is a p-type AlGaN layer or a p-type GaN layer. The p-type contact layer may alternatively be made of a p-type GaN-based semiconductor material substantially free of AlN. The p-type contact layer is preferably made thin, so as to reduce absorption of the deep UV light emitted from the active layer 16. The p-type contact layer has a thickness of 5 nm or larger and 30 nm or smaller, and typically has a thickness of 10 nm or larger and 20 nm or smaller.

The p-side contact electrode 20 is provided on the top face 18a of the p-type semiconductor layer 18. The p-side contact electrode 20 is made of a material that can establish ohmic contact with the p-type semiconductor layer 18 (p-type contact layer, for example), and with high deep UV reflectance. The p-side contact electrode 20 contains an Rh layer in direct contact with the top face 18a of the p-type semiconductor layer 18. The p-side contact electrode 20 is, for example, solely constituted by the Rh layer. The thickness of the Rh layer contained in the p-side contact electrode 20 is 50 nm or larger and 200 nm or smaller, and is typically 70 nm or larger and 150 nm or smaller. Density of the Rh layer contained in the p-side contact electrode 20 is 12 g/cm³ or larger, and is typically 12.2 g/cm³ or larger and 12.5 g/cm³ or smaller. Increase in the density of the Rh layer contained in the p-side contact electrode 20 can enhance a function thereof as a reflection electrode. With the density of the Rh layer controlled to be 12 g/cm³ or larger, obtainable is a reflectivity of 65% or larger for UV light of 280 nm wavelength.

The p-side cover electrode layer 22 is in direct contact with a top face 20a and a side face 20b of the p-side contact electrode 20, and entirely covers the p-side contact electrode 20. A footprint W2 of the p-side cover electrode layer 22 is wider than a footprint W1 of the p-side contact electrode 20. The p-side cover electrode layer 22 typically has a stacked structure of Ti/Rh/TiN. The thickness of the Ti layer in the p-side cover electrode layer 22 is 1 nm or larger and 50 nm or smaller, and is typically 5 nm or larger and 25 nm or smaller. The Ti layer in the p-side cover electrode layer 22 enhances adhesion between the Rh layer in the p-side contact electrode 20 and the Rh layer in the p-side cover electrode layer 22. The thickness of the Rh layer in the p-side cover electrode layer 22 is 5 nm or larger and 100 nm or smaller, and is typically 10 nm or larger and 50 nm or smaller. The TiN layer in the p-side cover electrode layer 22 is made of conductive titanium nitride (TiN). The thickness of the TiN layer in the p-side cover electrode layer 22 is 5 nm or larger and 100 nm or smaller, and is typically 10 nm or larger and 50 nm or smaller.

The dielectric protective layer 24 has a first contact opening 24p, and covers the p-side cover electrode layer 22 in an area other than the first contact opening 24p. The dielectric protective layer 24 covers the p-side contact electrode 20 in an area other than the first contact opening 24p. The dielectric protective layer 24 is in direct contact with the top face 22a and the side face 22b of the p-side cover electrode layer 22, and is in direct contact with the top face 18a of the p-type semiconductor layer 18. The dielectric protective layer 24 is made of a dielectric material, for example, silicon oxide ($SiO_2$). The thickness of the dielectric protective layer 24 is 50 nm or larger, and is typically 100 nm or larger and 500 nm or smaller.

A footprint W3 of the dielectric protective layer 24 is wider than the footprint W1 of the p-side contact electrode 20, wider than the footprint W2 of the p-side cover electrode layer 22, and narrower than a footprint W4 of the top face 18a of the p-type semiconductor layer 18. The dielectric protective layer 24 is arranged away from the outer circumference of the top face 18a of the p-type semiconductor layer 18. The first contact opening 24p is located above the p-side contact electrode 20 and the p-side cover electrode layer 22. A footprint W5 of the first contact opening 24p is wider than the footprint W2 of the p-side cover electrode layer 22, and is typically narrower than the footprint W1 of the p-side contact electrode 20.

The dielectric cover layer 26 covers the base layer 12, the n-type semiconductor layer 14, the active layer 16, the p-type semiconductor layer 18, the p-side contact electrode 20, the p-side cover electrode layer 22, and the dielectric protective layer 24. The dielectric cover layer 26 is made of a dielectric material different from the dielectric protective layer 24, which is typically $Al_2O_3$. The thickness of the dielectric cover layer 26 is 10 nm or larger and 100 nm or smaller, and is typically 20 nm or larger and 50 nm or smaller.

The dielectric cover layer 26 is in direct contact with, and thus covers, the second top face 12b of the base layer 12, the side face (or inclined face) 12d of the base layer 12 inclined at the third angle 83, and the side face (or inclined face) 12c of the base layer 12 inclined at the first angle 81. The dielectric cover layer 26 is also in direct contact with, and thus covers, the second top face 14b of the n-type semiconductor layer 14, the side face (or inclined face) 14c of the n-type semiconductor layer 14 inclined at the first angle θ1, and the side face (or inclined face) 14d of the n-type semiconductor layer 14 inclined at the second angle θ2. The dielectric cover layer 26 has a contact opening 26n arranged on the second top face 14b of the n-type semiconductor layer 14, and covers the second top face 14b of the n-type semiconductor layer 14 in an area other than the contact opening 26n.

The dielectric cover layer 26 is in direct contact with, and thus covers, the side face (or inclined face) 16d of the active layer 16 inclined at the second angle θ2. The dielectric cover layer 26 is in direct contact with, and thus covers, the top face 18a of the p-type semiconductor layer 18, and the side face (or inclined face) 18d of the p-type semiconductor layer 18 inclined at the second angle θ2. The dielectric cover layer 26 is in direct contact with a top face 24a and a side face 24b of the dielectric protective layer 24. The dielectric cover layer 26 has a second contact opening 26p, and covers the dielectric protective layer 24 in an area other than the second contact opening 26p. The second contact opening 26p is located above the p-side contact electrode 20 and the p-side cover electrode layer 22. A footprint of the second contact opening 26p is narrower than the footprint W2 of the p-side cover electrode layer 22, and is typically narrower than the footprint W1 of the p-side contact electrode 20. A footprint of the second contact opening 26p is same as the footprint W5 of the first contact opening 24p. A footprint of the second contact opening 26p may be larger than the footprint W5 of the first contact opening 24p.

A first area S1 (=W3−W2) where the top face 18a of the p-type semiconductor layer 18 is in contact with the dielectric protective layer 24, and a second area S2 (=W4−W3) where the top face 18a of the p-type semiconductor layer 18 is in contact with the dielectric cover layer 26, preferably follow a predetermined proportion relative to the total area S(=W4−W2) of the first area S1 and the second area S2. The first area S1 typically accounts for 10% or more of the total area S, preferably accounts for 20% or more, or 30% or more of the total area S. With the first area S1 controlled larger than a predetermined proportion, coverage of the p-side cover electrode layer 22 by the dielectric protective layer 24 may be improved. The first area S1 typically accounts for less than 90% of the total area S, preferably accounts for less than 80%, or less than 70% of the total area S. With the first area S1 controlled smaller than a predetermined proportion, diffusion of Si into the p-type semiconductor layer 18 can be suppressed. The first area S1 may be equivalent to the second area S2, and may typically account for 40% or more and less than 60% of the total area S. The first area S1 may alternatively be smaller than the second area S2. The first area S1 may account for less than 50% of the total area S, and may account for 40% or less, or 30% or less. This case can more suitably suppress Si from diffusing into the p-type semiconductor layer 18.

The n-side contact electrode 28 is arranged on the second top face 14b of the n-type semiconductor layer 14. The n-side contact electrode 28 is arranged to fill up the contact opening 26n, and overlaps the dielectric cover layer 26 outside the contact opening 26n. A footprint W8 of the n-side contact electrode 28 is wider than a footprint W7 of the contact opening 26n.

The n-side contact electrode 28 typically has a stacked structure of Ti/Al/Ti/TiN. A first Ti layer in the n-side contact electrode 28 is in direct contact with the second top face 14b of the n-type semiconductor layer 14. The thickness of a first Ti layer in the n-side contact electrode 28 is 1 nm or larger and 10 nm or smaller, and is preferably 5 nm or larger and 2 nm or smaller. An Al layer in the n-side contact electrode 28 is arranged on the first Ti layer, in direct contact with the first Ti layer. The thickness of the Al layer in the n-side contact electrode 28 is 200 nm or larger, and is typically 300 nm or larger and 1000 nm or smaller. A second Ti layer in the n-side contact electrode 28 is arranged on the Al layer, in direct contact with the Al layer. The thickness of the second Ti layer in the n-side contact electrode 28 is 1 nm or larger and 50 nm or smaller, and is typically 5 nm or larger and 25 nm or smaller. A TiN layer in the n-side contact electrode 28 is arranged on the second Ti layer, in direct contact with the second Ti layer. The TiN layer in the n-side contact electrode 28 is made of conductive TiN. The thickness of the TiN layer in the n-side contact electrode 28 is 5 nm or larger and 100 nm or smaller, and is typically 10 nm or larger and 50 nm or smaller.

The p-side current diffusion layer 30 is arranged on the top face 22*a* of the p-side cover electrode layer 22, in direct contact with the p-side cover electrode layer 22 in the contact opening (first contact opening 24*p* and second contact opening 26*p*). The p-side current diffusion layer 30 is arranged so as to fill up the first contact opening 24*p* and the second contact opening 26*p*, in direct contact with the dielectric cover layer 26 outside the second contact opening 26*p*. A footprint W6 of the p-side current diffusion layer 30 is wider than the footprint W5 of the first contact opening 24*p*. The p-side current diffusion layer 30 typically has a stacked structure of TiN/Ti/Rh/TiN/Ti/Au.

The n-side current diffusion layer 32 is in direct contact with a top face 28*a* and a side face 28*b* of the n-side contact electrode 28, and covers the n-side contact electrode 28. The n-side current diffusion layer 32 is in direct contact with the dielectric cover layer 26 outside the n-side contact electrode 28. A footprint W9 of the n-side current diffusion layer 32 is wider than the footprint W8 of the n-side contact electrode 28. The n-side current diffusion layer 32 is structured similarly to the p-side current diffusion layer 30, and typically has a stacked structure of TiN/Ti/Rh/TiN/Ti/Au.

The dielectric sealing layer 34 is in direct contact with, and thus covers, the dielectric cover layer 26, the p-side current diffusion layer 30, and the n-side current diffusion layer 32. The dielectric sealing layer 34 has a p-side pad opening 34*p* formed on the p-side current diffusion layer 30, and an n-side pad opening 34*n* formed on the n-side current diffusion layer 32. The dielectric sealing layer 34 covers the p-side current diffusion layer 30 in an area other than the p-side pad opening 34*p*, and covers the n-side current diffusion layer 32 in an area other than the n-side pad opening 34*n*. The dielectric sealing layer 34 is made of a dielectric material different from the dielectric cover layer 26, which is typically SiO$_2$. The thickness of the dielectric sealing layer 34 is 300 nm or larger and 1500 nm or smaller, and is typically 600 nm or larger and 1000 nm or smaller.

The p-side pad electrode 36 is arranged on the p-side current diffusion layer 30, in contact with the p-side current diffusion layer 30 in the p-side pad opening 34*p*. The p-side pad electrode 36 is provided so as to fill up the p-side pad opening 34*p*, in direct contact with the dielectric sealing layer 34 outside the p-side pad opening 34*p*. The p-side pad electrode 36 is electrically connected to the p-side contact electrode 20, via the p-side current diffusion layer 30 and the p-side cover electrode layer 22.

The n-side pad electrode 38 is arranged on the n-side current diffusion layer 32, in contact with the n-side current diffusion layer 32 in the n-side pad opening 34*n*. The n-side pad electrode 38 is provided so as to fill up the n-side pad opening 34*n*, in direct contact with the dielectric sealing layer 34 outside the n-side pad opening 34*n*. The n-side pad electrode 38 is electrically connected to the n-side contact electrode 28, via the n-side current diffusion layer 32.

The p-side pad electrode 36 and the n-side pad electrode 38 are parts to be bonded, when the semiconductor light-emitting element 10 is mounted on a package substrate or the like. Each of the p-side pad electrode 36 and the n-side pad electrode 38 typically has a stacked structure of Ni/Au, Ti/Au, or Ti/Pt/Au. The thickness of each of the p-side pad electrode 36 and the n-side pad electrode 38 is 100 nm or larger, and is typically 200 nm or larger and 1000 nm or smaller.

Figure 2:
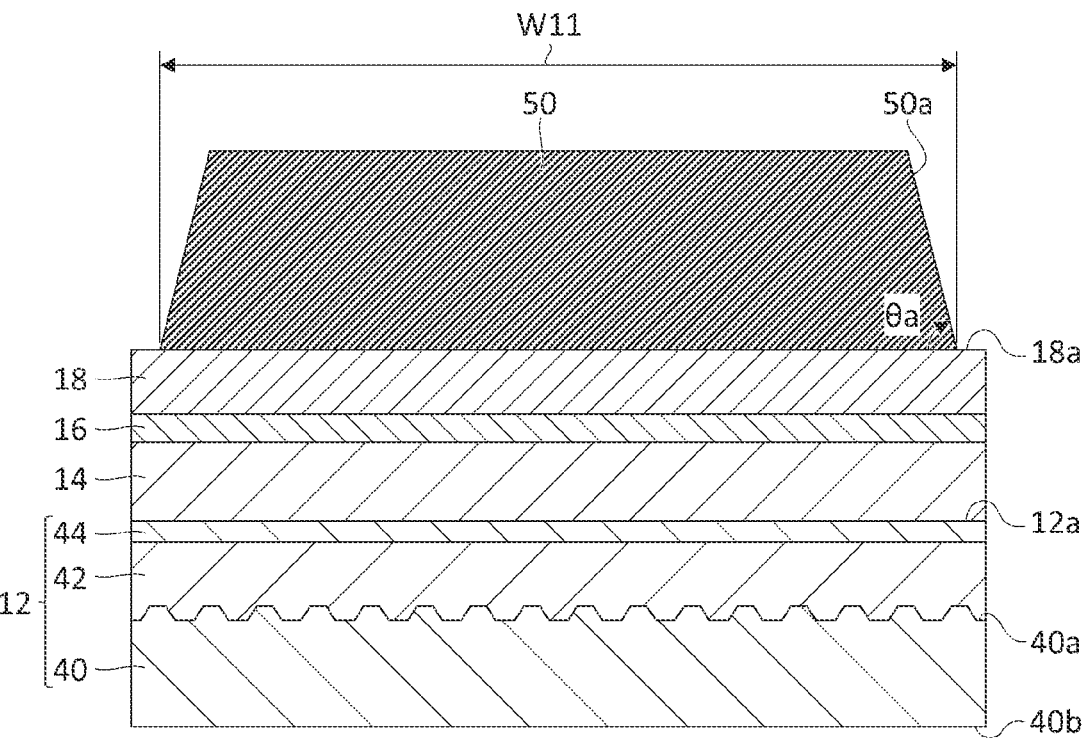
FIG. 2 is a drawing schematically illustrating a manufacturing process of the semiconductor light-emitting element.

Next, a method for manufacturing the semiconductor light-emitting element 10 will be explained. FIGS. 2 to 13 are drawings schematically illustrating processes of manufacturing the semiconductor light-emitting element 10. First, as illustrated in FIG. 2, the first buffer layer 42 and the second buffer layer 44 are sequentially formed on the first principal face 40*a* of the substrate 40, to form the base layer 12. Next, the n-type semiconductor layer 14, the active layer 16, and the p-type semiconductor layer 18 are sequentially formed, on the first top face 12*a* of the base layer 12.

The substrate 40 is typically a patterned sapphire substrate. The first buffer layer 42 is typically an undoped AlN layer. The second buffer layer 44 is typically an undoped AlGaN layer. The n-type semiconductor layer 14 is typically an n-type AlGaN layer. The active layer 16 is typically an undoped AlGaN layer. The p-type semiconductor layer 18 is a p-type AlGaN layer or a p-type GaN layer. The first buffer layer 42, the second buffer layer 44, the n-type semiconductor layer 14, the active layer 16, and the p-type semiconductor layer 18 may be formed by any of known epitaxial growth methods, such as metal organic vapor phase epitaxy (MOVPE) or molecular beam epitaxy (MBE).

Next, as illustrated in FIG. 2, a first mask 50 is formed on the top face 18*a* of the p-type semiconductor layer 18, typically by a known lithographic technology. The first mask 50 is formed in a first mask area W11, which is a part of the top face 18*a* of the p-type semiconductor layer 18. The first mask 50 has an inclined first side face 50*a*. An angle of inclination θa of the first side face 50*a* is preset so as to form, in the subsequent etching process, a side face (or inclined face) that inclines at the first angle θ1. The angle of inclination θa of the first side face 50*a* is adjustable by controlling post-baking temperature of a resist resin that composes the first mask 50. For example, the angle of inclination θa of the first side face 50*a* may be increased by lowering the post-baking temperature of the resist resin, meanwhile the angle of inclination θa of the first side face 50*a* may be reduced by elevating the post-baking temperature of the resist resin.

Figure 3:
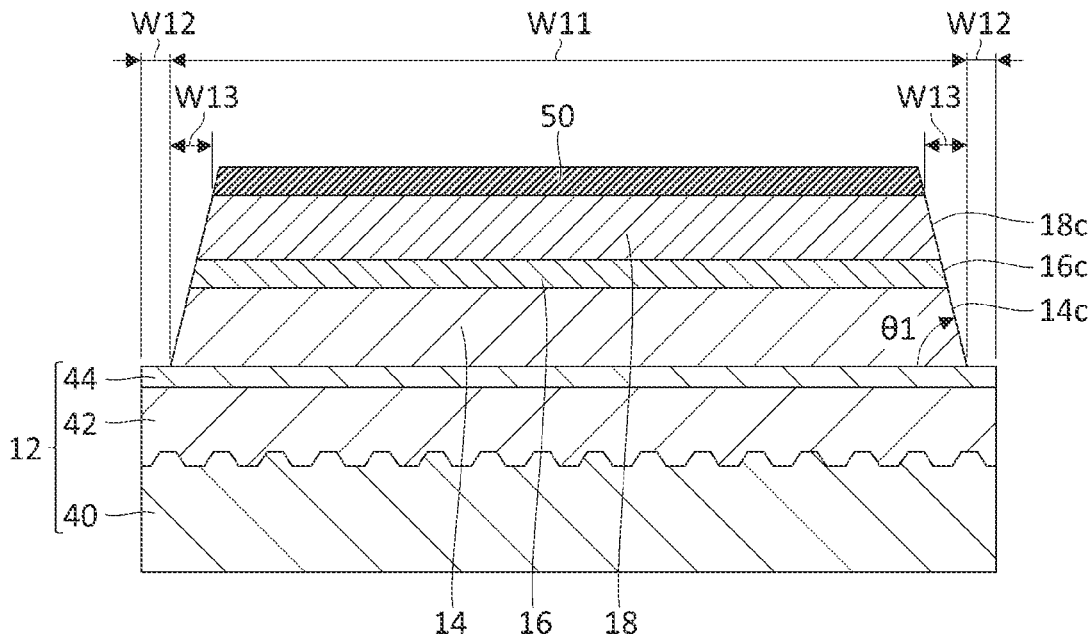
FIG. 3 is a drawing schematically illustrating a manufacturing process of the semiconductor light-emitting element.

Next, as illustrated in FIG. 3, the n-type semiconductor layer 14, the active layer 16, and the p-type semiconductor layer 18 are dry-etched overall, from above the first mask 50, thereby making the base layer 12 exposed in an outer circumferential area W12 not shaded by the first mask 50. Meanwhile within the first mask area W11 and further in a first side face area W13 in which the first side face 50*a* had ever located, there are formed side faces 14*c*, 16*c*, and 18*c*, all inclined at the first angle θ1, respectively in the n-type semiconductor layer 14, the active layer 16, and the p-type semiconductor layer 18. The first mask 50 is then removed.

Figure 4:
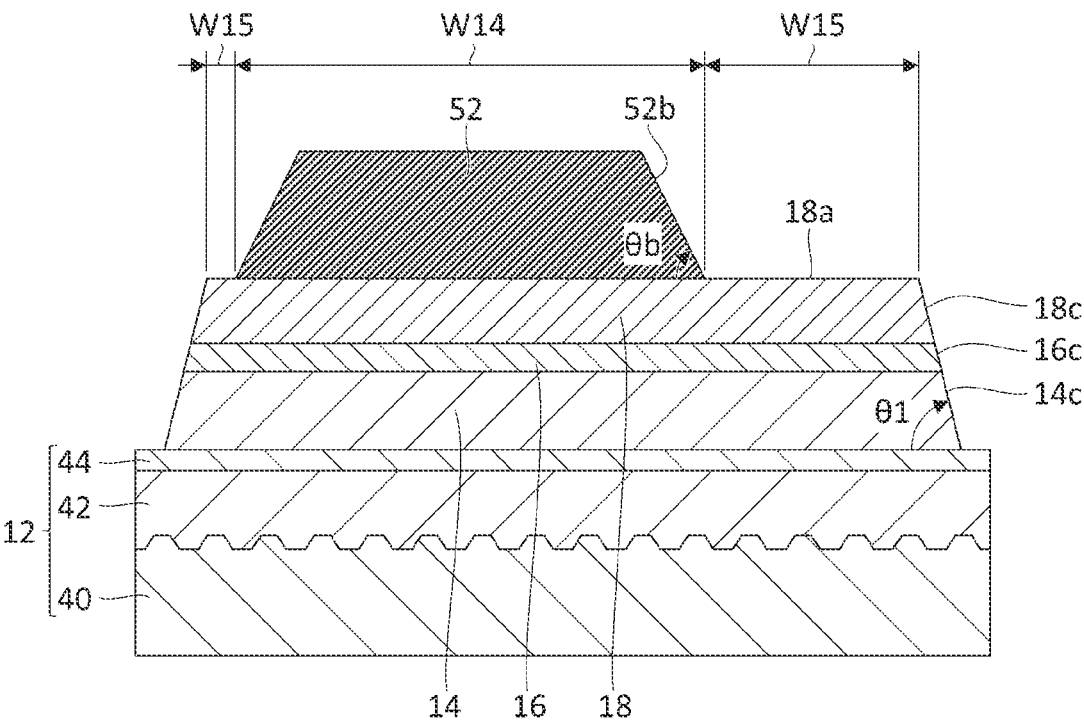
FIG. 4 is a drawing schematically illustrating a manufacturing process of the semiconductor light-emitting element.

Next, as illustrated in FIG. 4, a second mask 52 is formed on the top face 18*a* of the p-type semiconductor layer 18, typically by a known lithographic technology. The second mask 52 is formed in a second mask area W14, which is a part of the top face 18*a* of the p-type semiconductor layer 18. The second mask 52 is not formed in an unmasked area W15, which is on the top face 18*a* of the p-type semiconductor layer 18 but other than the second mask area W14. The second mask 52 has an inclined second side face 52*b*. An angle of inclination θb of the second side face 52*b* is preset so as to form, in the subsequent etching process, a side face (or inclined face) that inclines at the second angle θ2. The angle of inclination θb of the second side face 52*b* is adjustable by controlling post-baking temperature of a resist resin that composes the second mask 52, similarly to the first side face 50a of the first mask 50.

Figure 5:
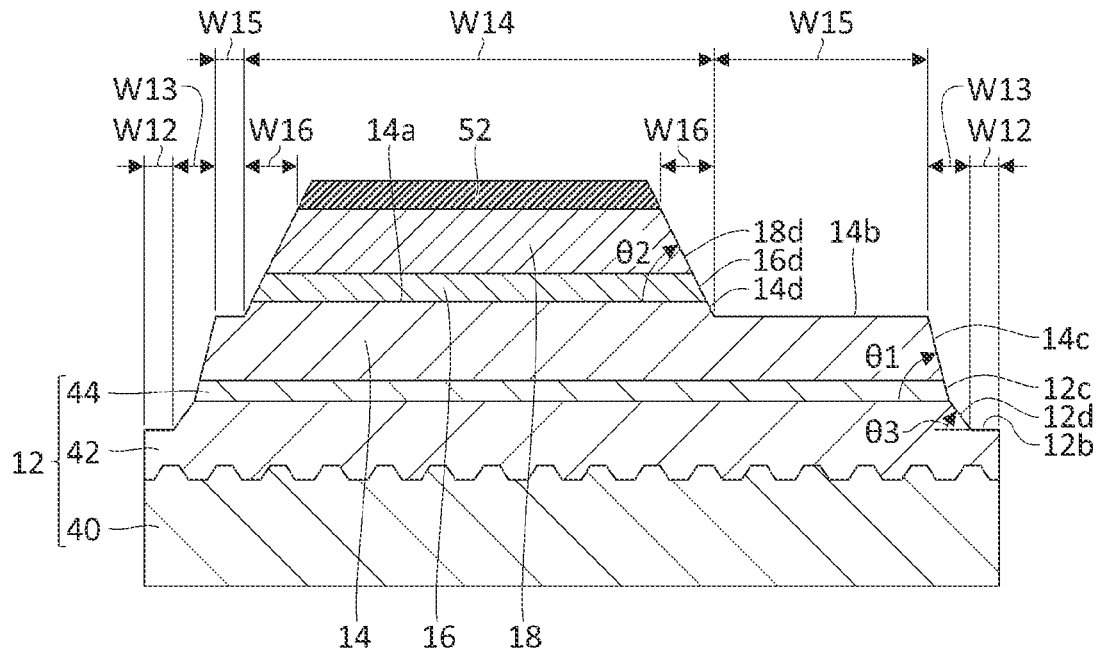
FIG. 5 is a drawing schematically illustrating a manufacturing process of the semiconductor light-emitting element.

Next, as illustrated in FIG. 5, the base layer 12, the n-type semiconductor layer 14, the active layer 16, and the p-type semiconductor layer 18 are dry-etched overall, from above the second mask 52. The dry etching process of FIG. 5 is continued until the n-type semiconductor layer 14 is exposed in the unmasked area W15, and the second top face 14b is formed. Meanwhile within the second mask area W14 and specifically in a second side face area W16 in which the second side face 52b had ever located, there are formed side faces 14d, 16d, and 18d, all inclined at the second angle 82, respectively in the n-type semiconductor layer 14, the active layer 16, and the p-type semiconductor layer 18. Meanwhile, in an area not shaded by the second mask 52 and specifically in the outer circumferential area W12, the first buffer layer 42 is exposed and the second top face 12b is formed. In the area not shaded by the second mask 52 and specifically in the first side face area W13, there are formed the side faces 14c and 12c, both inclined at the first angle 81, respectively in the n-type semiconductor layer 14 and the second buffer layer 44, meanwhile there is formed the side face 12d inclined at the third angle 83 in the first buffer layer 42. The inclined side faces 12c, 12d, and 14c are thus formed in the base layer 12 and in the n-type semiconductor layer 14, since the side faces 14c, 16c, and 18c, inclined at the first angle 81 in the first side face area W13, functioned as a mask.

The side face 12d of the first buffer layer 42 inclined at the third angle 83 is formed, as a result of compositional difference between the n-type semiconductor layer 14 and the first buffer layer 42. The first buffer layer 42 has an AlN proportion larger than that of the n-type semiconductor layer 14. The AlGaN-based semiconductor material becomes less likely to be etched as the AlN proportion increases. Since the first buffer layer 42 is less likely to be etched than the n-type semiconductor layer 14, so that the amount of etching of the first buffer layer 42 will become smaller than the amount of etching of the n-type semiconductor layer 14, under the same etching conditions. This consequently makes the third angle 83, at which the side face 12c of the first buffer layer 42 inclines, smaller than the first angle 81 at which the side face 14c of the n-type semiconductor layer 14 inclines. On the other hand, since the second buffer layer 44 has the AlN proportion same as that of the n-type semiconductor layer 14, so that the second buffer layer 44 will have formed therein the side face 12c inclined at the first angle θ1. The second mask 52 is then removed.

Figure 6:
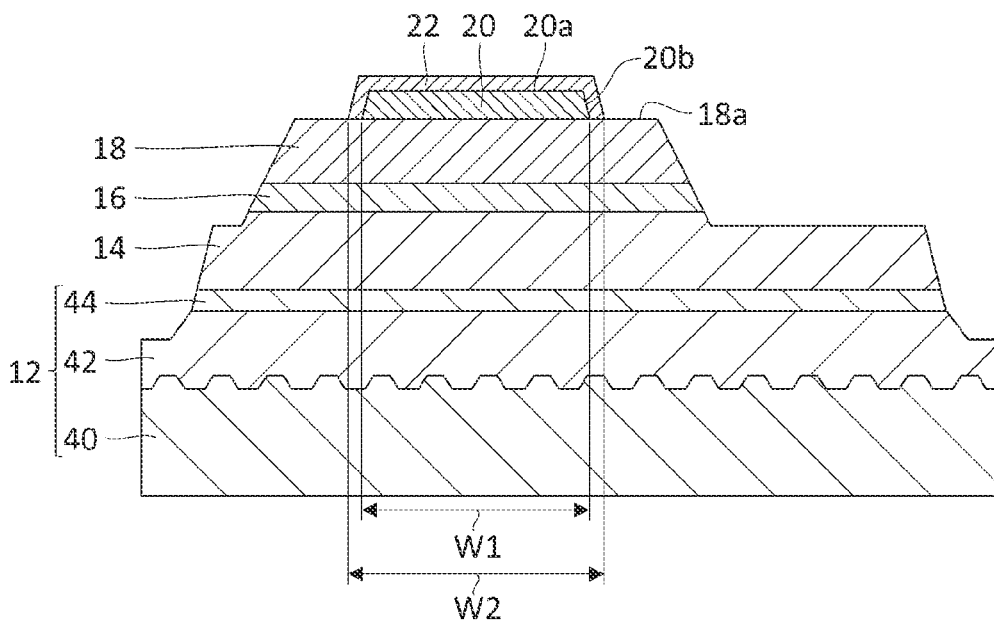
FIG. 6 is a drawing schematically illustrating a manufacturing process of the semiconductor light-emitting element.

Next, as illustrated in FIG. 6, the p-side contact electrode 20 is formed in an area W1 which is a part of the top face 18a of the p-type semiconductor layer 18, typically by a known lithographic technology. The p-side contact electrode 20 contains an Rh layer in direct contact with the top face 18a of the p-type semiconductor layer 18. The Rh layer in the p-side contact electrode 20 is formed by vacuum evaporation at a temperature of 100° C. or below. Use of vacuum evaporation for forming the Rh layer can reduce damage on the top face 18a of the p-type semiconductor layer 18, as compared with a case where sputtering is employed, thus lowering contact resistance of the p-side contact electrode 20.

After forming the p-side contact electrode 20, the p-side contact electrode 20 is annealed. The p-side contact electrode 20 is typically annealed by rapid thermal annealing (RTA), at a temperature of 500° C. or higher and 650° C. or lower. The annealing of p-side contact electrode 20 lowers the contact resistance of the p-side contact electrode 20, and increases the density of the Rh layer contained in the p-side contact electrode 20 up to 12 $g/cm^3$ or larger. The annealed Rh layer typically has a density of 12.2 $g/cm^3$ or larger and 12.5 $g/cm^3$ or smaller, and has a UV reflectivity at 280 nm wavelength of 65% or larger, which is approximately 66% to 67%, for example.

Next, as illustrated in FIG. 6, the p-side cover electrode layer 22 is formed so as to entirely cover the p-side contact electrode 20, typically by a known lithographic technology. A footprint W2 of the p-side cover electrode layer 22 is wider than a footprint W1 of the p-side contact electrode 20. The p-side cover electrode layer 22 is in contact with the top face 20a and the side face 20b of the p-side contact electrode 20, and typically has a stacked structure of Ti/Rh/TiN. The p-side cover electrode layer 22 is formed typically by sputtering, at a temperature of 100° C. or below. Use of sputtering for forming the p-side cover electrode layer 22 can enhance adhesion of the p-side cover electrode layer 22 to the p-side contact electrode 20.

Figure 7:
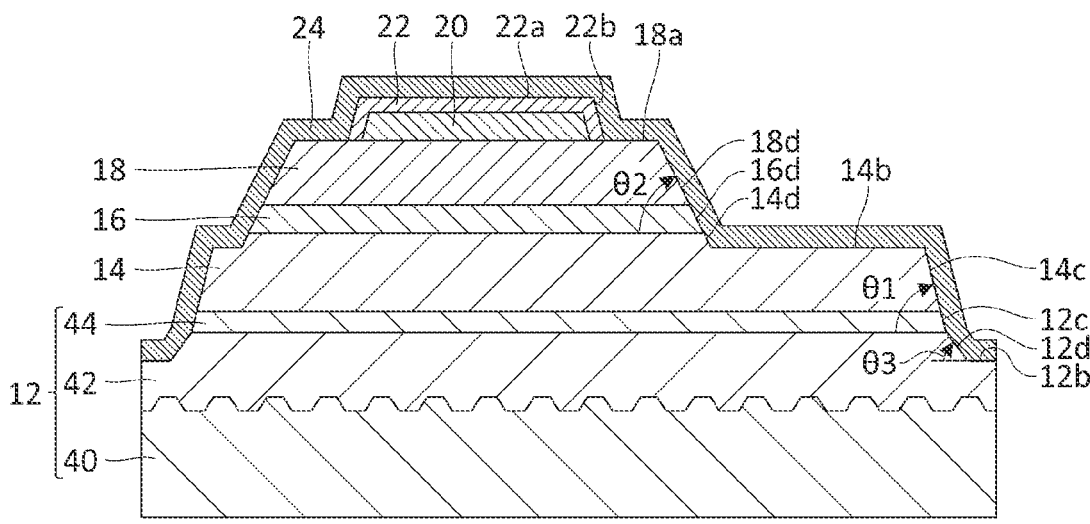
FIG. 7 is a drawing schematically illustrating a manufacturing process of the semiconductor light-emitting element.

Next, as illustrated in FIG. 7, the dielectric protective layer 24 is formed. The dielectric protective layer 24 is formed entirely over the element structure, thus covering the base layer 12, the n-type semiconductor layer 14, the active layer 16, the p-type semiconductor layer 18, the p-side contact electrode 20, and the p-side cover electrode layer 22. The dielectric protective layer 24 is typically made of $SiO_2$, which can be formed by plasma enhanced chemical vapor deposition (PECVD).

As seen in FIG. 7, the dielectric protective layer 24 is in contact with the second top face 12b of the base layer 12, the side face 12d of the base layer 12 inclined at the third angle θ3, and the side face 12c of the base layer 12 inclined at the first angle θ1. The dielectric protective layer 24 is in contact with the second top face 14b of the n-type semiconductor layer 14, the side face 14c of the n-type semiconductor layer 14 inclined at the first angle θ1, and the side face 14d of the n-type semiconductor layer 14 inclined at the second angle θ2. The dielectric protective layer 24 is in contact with the side face 16d of the active layer 16 inclined at the first angle θ1, and the side face 18d of the p-type semiconductor layer 18 inclined at the first angle θ1. The dielectric protective layer 24 is in contact with the top face 18a of the p-type semiconductor layer 18, and the top face 22a and the side face 22b of the p-side cover electrode layer 22.

Figure 8:
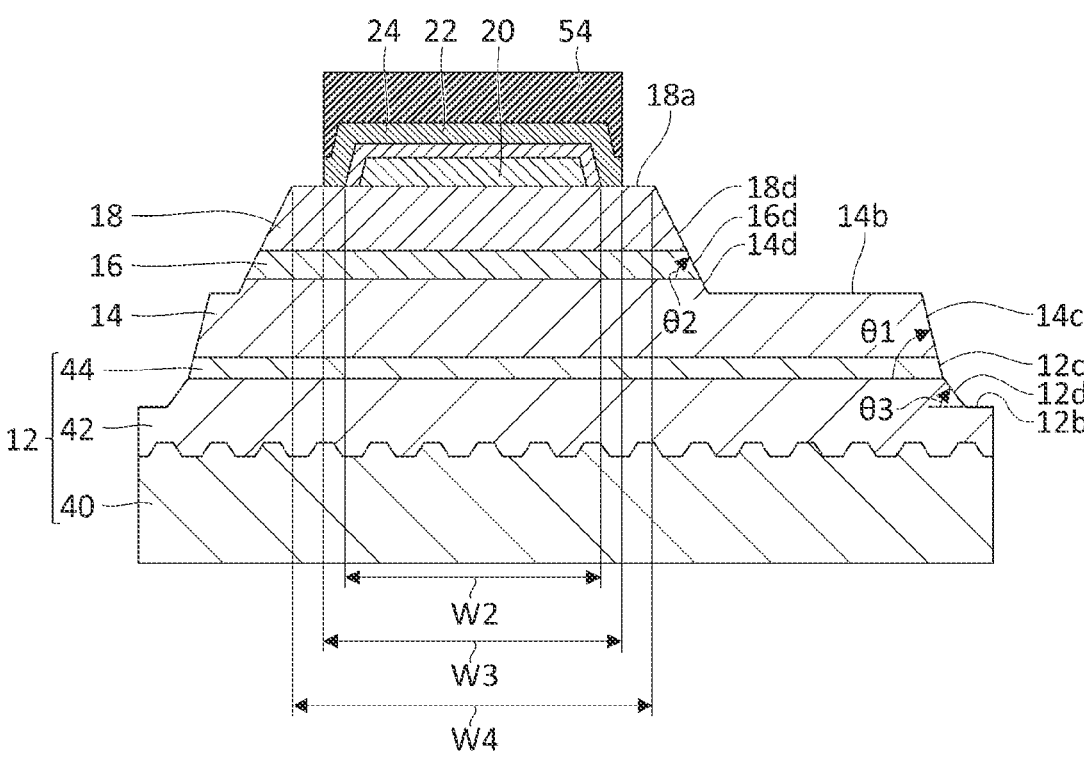
FIG. 8 is a drawing schematically illustrating a manufacturing process of the semiconductor light-emitting element.

Next, as illustrated FIG. 8, a third mask 54 is formed on the dielectric protective layer 24, typically by a known lithographic technology. The footprint W3 of the third mask 54 is wider than the footprint W2 of the p-side cover electrode layer 22, and narrower than the footprint W4 of the top face 18a of the p-type semiconductor layer 18. The third mask 54 is therefore provided in an area that entirely overlaps the p-side contact electrode 20. After forming the third mask 54, the dielectric protective layer 24 in an area not shaded by the third mask 54 is removed by wet etching. The dielectric protective layer 24, when made of $SiO_2$, may be removed by using buffered hydrofluoric acid (BHF) which is a mixed solution of hydrofluoric acid (HF) and ammonium fluoride ($NH_4F$). Use of wet etching for removing the dielectric protective layer 24 can reduce damages possibly exerted on the n-type semiconductor layer 14, the active layer 16, and the p-type semiconductor layer 18, as compared with a case where the dielectric protective layer 24 were dry-etched.

As seen in FIG. 8, as a result of partial removal of the dielectric protective layer 24, there are exposed second top face 12b of the base layer 12, the side face 12d of the base layer 12 inclined at the third angle 83, and the side face 12c of the base layer 12 inclined at the first angle 81. Also the second top face 14*b* of the n-type semiconductor layer 14, the side face 14*c* of the n-type semiconductor layer 14 inclined at the first angle 81, and the side face 14*d* of the n-type semiconductor layer 14 inclined at the second angle 82 are exposed. Also the side face 16*d* of the active layer 16 inclined at the first angle 81, the side face 18*d* of the p-type semiconductor layer 18 inclined at the first angle 81, and a part of the top face 18*a* of the p-type semiconductor layer 18 are exposed.

Figure 9:
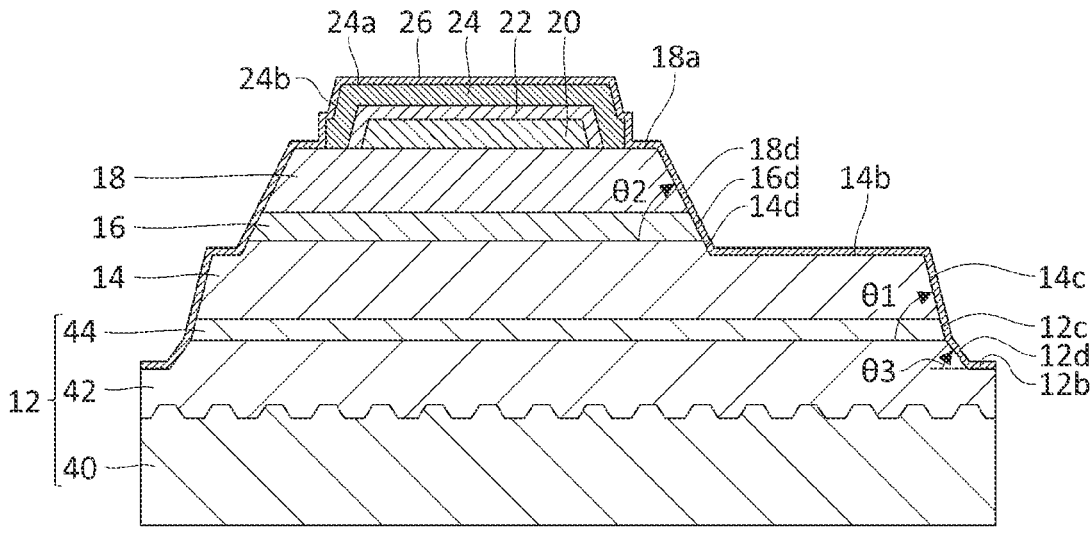
FIG. 9 is a drawing schematically illustrating a manufacturing process of the semiconductor light-emitting element.

Next, as illustrated in FIG. 9, the dielectric cover layer 26 is formed. The dielectric cover layer 26 is formed entirely over the element structure, thus covering the base layer 12, the n-type semiconductor layer 14, the active layer 16, the p-type semiconductor layer 18, the p-side contact electrode 20, the p-side cover electrode layer 22, and the dielectric protective layer 24. The dielectric cover layer 26 is typically made of $Al_2O_3$, which may be formed by atomic layer deposition (ALD).

As seen in FIG. 9, the dielectric cover layer 26 is in contact with the second top face 12*b* of the base layer 12, the side face 12*d* of the base layer 12 inclined at the third angle 83, and the side face 12*c* of the base layer 12 inclined at the first angle 81. The dielectric cover layer 26 is in contact with the second top face 14*b* of the n-type semiconductor layer 14, the side face 14*c* of the n-type semiconductor layer 14 inclined at the first angle 81, and the side face 14*d* of the n-type semiconductor layer 14 inclined at the second angle 82. The dielectric cover layer 26 is in contact with the side face 16*d* of the active layer 16 inclined at the first angle 81, and the side face 18*d* of the p-type semiconductor layer 18 inclined at the first angle 81. The dielectric cover layer 26 is in contact with the top face 18*a* of the p-type semiconductor layer 18, and the top face 24*a* and the side face 24*b* of the dielectric protective layer 24.

Figure 10:
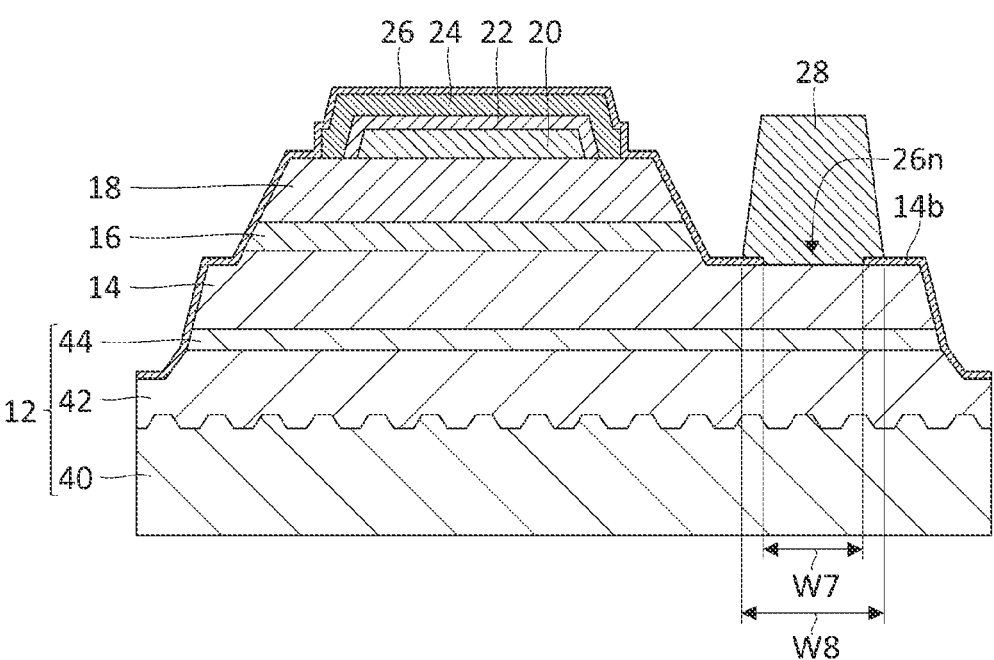
FIG. 10 is a drawing schematically illustrating a manufacturing process of the semiconductor light-emitting element.

Next, as illustrated in FIG. 10, the dielectric cover layer 26 is partially removed typically by a known lithographic technology and dry etching, to form the contact opening 26*n*. The contact opening 26*n* is formed in the footprint W7 which is a part of the second top face 14*b* of the n-type semiconductor layer 14. The contact opening 26*n* is formed so as to extend through the dielectric cover layer 26, so that the second top face 14*b* of the n-type semiconductor layer 14 exposes in the contact opening 26*n*.

Next, as illustrated in FIG. 10, the n-side contact electrode 28 is formed so as to fill up the contact opening 26*n*, typically by a known lithographic technology. A footprint W8 of the n-side contact electrode 28 is wider than a footprint W7 of the contact opening 26*n*. The n-side contact electrode 28 typically has a stacked structure of Ti/Al/Ti/TiN, in contact with the second top face 14*b* of the n-type semiconductor layer 14. The n-side contact electrode 28 may be formed by sputtering.

After forming the n-side contact electrode 28, the n-side contact electrode 28 is annealed. The n-side contact electrode 28 is annealed typically by RTA, at a temperature of 500° C. or higher and 650° C. or lower. Annealing of the n-side contact electrode 28 lowers the contact resistance of the n-side contact electrode 28. When annealing the n-side contact electrode 28, also the p-side cover electrode layer 22 is concurrently annealed at a temperature of 500° C. or higher and 650° C. or lower. Annealing of the p-side cover electrode layer 22 can enhance adhesion between the p-side cover electrode layer 22 and the dielectric protective layer 24.

Figure 11:
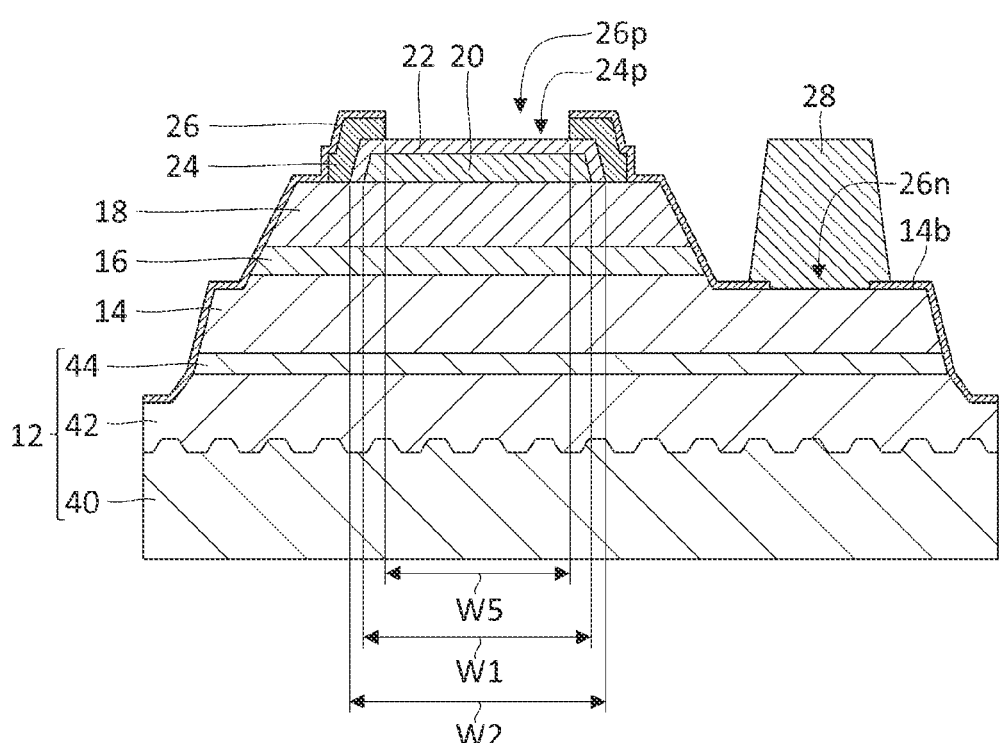
FIG. 11 is a drawing schematically illustrating a manufacturing process of the semiconductor light-emitting element.

Next, as illustrated in FIG. 11, the dielectric protective layer 24 and the dielectric cover layer 26 are partially removed typically by a known lithographic technology and dry etching, to form the first contact opening 24*p* and the second contact opening 26*p* (also collectively referred to as contact openings). First, the second contact opening 26*p* is formed so as to extend through the dielectric cover layer 26, and the first contact opening 24*p* is then formed so as to extend through the dielectric protective layer 24. The top face 22*a* of the p-side cover electrode layer 22 is exposed in the first contact opening 24*p*. The footprint W5 of the first contact opening 24*p* and the second contact opening 26*p* is narrower than the footprint W2 of the p-side cover electrode layer 22, and is typically narrower than the footprint W1 of the p-side contact electrode 20.

The first contact opening 24*p* and the second contact opening 26*p* may be formed successively, with use of a common mask. The first contact opening 24*p* and the second contact opening 26*p* may however be formed with use of separate masks, rather than the common mask. The second contact opening 26*p* may be formed after the n-side contact electrode 28 is formed, or before the n-side contact electrode 28 is formed. For example, when forming the contact opening 26*n* illustrated in FIG. 10, the second contact opening 26*p* may be formed concurrently.

Figure 12:
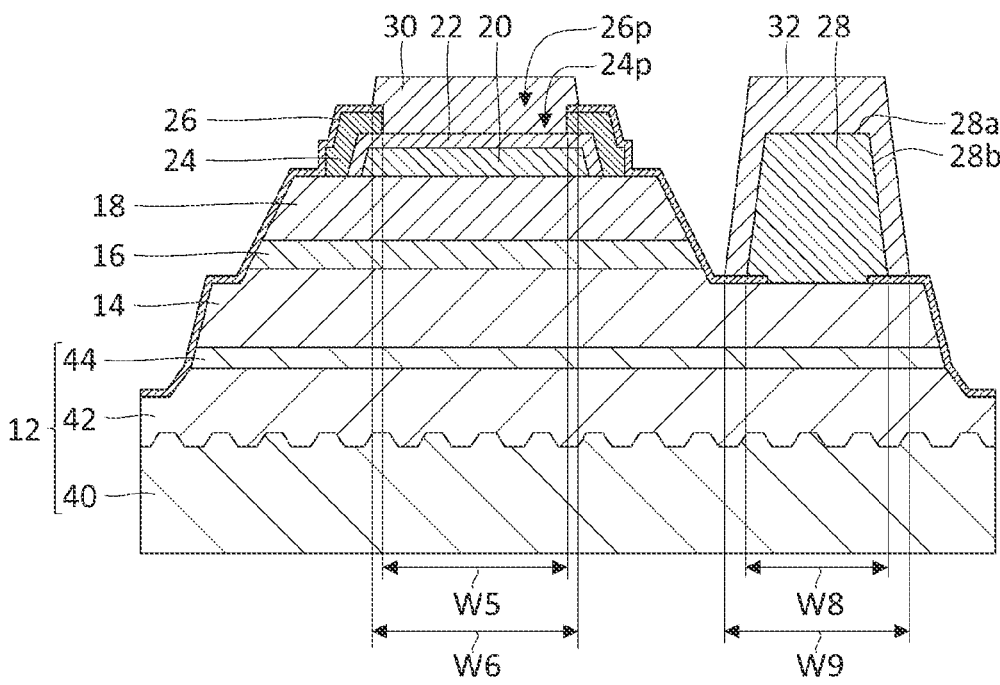
FIG. 12 is a drawing schematically illustrating a manufacturing process of the semiconductor light-emitting element.

Next, as illustrated in FIG. 12, the p-side current diffusion layer 30 in electrical contact with the p-side cover electrode layer 22 is formed in the contact openings (the first contact opening 24*p* and the second contact opening 26*p*), and the n-side current diffusion layer 32 is formed so as to cover the top face 28*a* and the side face 28*b* of the n-side contact electrode 28, by a known lithographic technology. A footprint W6 of the p-side current diffusion layer 30 is wider than the footprint W5 of the first contact opening 24*p*. A footprint W9 of the n-side current diffusion layer 32 is wider than the footprint W8 of the n-side contact electrode 28. Each of the p-side current diffusion layer 30 and the n-side current diffusion layer 32 typically has a stacked structure of TiN/Ti/Rh/TiN/Ti/Au. The p-side current diffusion layer 30 and the n-side current diffusion layer 32 may be formed at the same time by sputtering.

Figure 13:
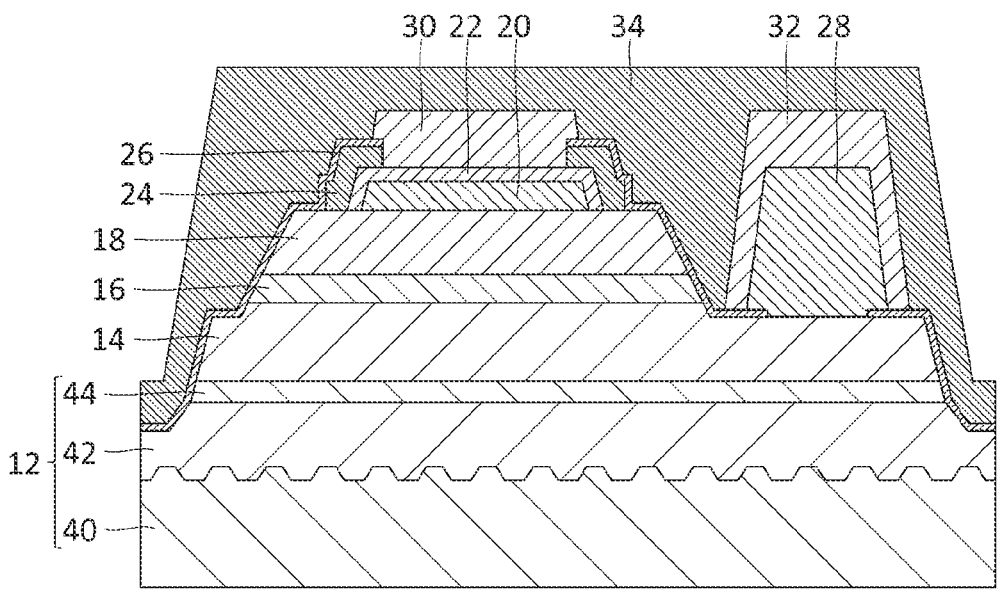
FIG. 13 is a drawing schematically illustrating a manufacturing process of the semiconductor light-emitting element.

Next, as illustrated in FIG. 13, the dielectric sealing layer 34 is formed. The dielectric sealing layer 34 is entirely formed over the element structure, in direct contact with, and thus covers, the dielectric cover layer 26, the p-side current diffusion layer 30, and the n-side current diffusion layer 32. The dielectric sealing layer 34 is typically made of $SiO_2$, and may be formed by PECVD. The dielectric sealing layer 34 is formed at a temperature of 200° C. or higher and 300° C. or lower.

Next, as illustrated in FIG. 1, the dielectric sealing layer 34 is partially removed typically by dry etching, to form the p-side pad opening 34*p* and the n-side pad opening 34*n*. The p-side pad opening 34*p* and the n-side pad opening 34*n* are formed so as to extend through the dielectric sealing layer 34. The p-side current diffusion layer 30 is exposed in the p-side pad opening 34*p*, and the n-side current diffusion layer 32 is exposed in the n-side pad opening 34*n*. Next, the p-side pad electrode 36 in electrical contact with the p-side current diffusion layer 30 is formed in the p-side pad opening 34*p* so as to fill up the p-side pad opening 34*p*, and the n-side pad electrode 38 in electrical contact with the n-side current diffusion layer 32 is formed in the n-side pad opening 34*n* so as to fill up the n-side pad opening 34*n*. The p-side pad electrode 36 and the n-side pad electrode 38, although formable at the same time, may be formed separately.

Upon completion of these processes, the semiconductor light-emitting element 10 illustrated in FIG. 1 is produced.

Since the base layer 12 has, in the outer circumference thereof, the side face 12d that inclines at the third angle 83 which is smaller than the first angle 81, so that this embodiment can suppress the dielectric protective layer 24 and the dielectric sealing layer 34 from cracking or delaminating. This enhances the reliability of the dielectric protective layer 24 and the dielectric sealing layer 34.

With the third angle 83 adjusted to 40 degrees or smaller, this embodiment can more suitably suppress the dielectric protective layer 24 and the dielectric sealing layer 34 from cracking or delaminating. Moreover, with the first angle 81 adjusted to 70 degrees or smaller, the dielectric cover layer 26 and the dielectric sealing layer 34 may be more suitably prevented from cracking or delaminating.

With the first angle 81 made relatively large, typically larger than 40 degrees, this embodiment can enlarge the area of the first top face 14a and the second top face 14b of the n-type semiconductor layer 14. This can enlarge the areas occupied by the active layer 16 and the n-side contact electrode 28, and can enhance the light emission efficiency per unit area of the light extraction face 12e. With the second angle 82 made relatively small, typically 40 degrees or smaller, this embodiment can make the deep UV light, emitted horizontally from the active layer 16, reflect on the side face 16d inclined at the second angle 82 towards the light extraction face 12e, thereby enhancing the light extraction efficiency.

With the dielectric cover layer 26, in direct contact with the active layer 16, made of $Al_2O_3$ but not $SiO_2$, this embodiment can suppress diffusion of Si into the active layer 16. Also with the p-side contact electrode 20 and the p-side cover electrode layer 22 covered with the dielectric protective layer 24 made of $SiO_2$, the p-side contact electrode 20 and the p-side cover electrode layer 22 may be suppressed from degrading, thereby suppressing the p-side contact electrode 20 from degrading the reflection property. Moreover, with the top face of the element entirely covered with the dielectric cover layer 26 and the dielectric sealing layer 34, this embodiment can more suitably suppress the n-type semiconductor layer 14, the active layer 16, and the p-type semiconductor layer 18 from degrading.

With the footprint W3 of the dielectric protective layer 24 made of $SiO_2$ narrower than the footprint W4 of the top face 18a of the p-type semiconductor layer 18, this embodiment can further reduce the area where the top face 18a of the p-type semiconductor layer 18 and the dielectric protective layer 24 come into contact. This can suppress Si from diffusing into the p-type semiconductor layer 18. In particular, with the first area S1 (=W3−W2) where the top face 18a of the p-type semiconductor layer 18 and the dielectric protective layer 24 come into contact made smaller than the second area S2 (=W4−W3) where the top face 18a of the p-type semiconductor layer 18 and the dielectric cover layer 26 come into contact, this embodiment can more suitably suppress Si from diffusing into the p-type semiconductor layer 18.

With the side faces 14d, 16d, and 18d inclined at the second angle θ2, formed after forming the side faces 14c, 16c, and 18c inclined at the first angle θ1, this embodiment can concurrently form the side face 12d inclined at the third angle θ3. This makes a mask, specialized for forming the side face 12d inclined at the third angle ƒ3, no more necessary, thus simplifying the manufacturing process.

With the dielectric protective layer 24 made of $SiO_2$ once formed entirely over the element and then removed in the unnecessary area, this embodiment can improve quality of the dielectric protective layer 24. Also with the dielectric protective layer 24 made of $SiO_2$ removed by wet etching, this embodiment can more exactly remove the unnecessary area of the dielectric protective layer 24, while suppressing possible damages on the side faces 14d, 16d, and 18d of the n-type semiconductor layer 14, the active layer 16, and the p-type semiconductor layer 18.

Having described the embodiment in which the base layer 12 contains the substrate 40 made of sapphire, the first buffer layer 42 made of undoped AlN, and the second buffer layer 44 made of undoped AlGaN. In an embodiment, the base layer 12 does not always necessarily contain the second buffer layer 44, instead allowing the n-type semiconductor layer 14 to be arranged directly on the first buffer layer 42 which is an undoped AlN layer. In an embodiment, the base layer 12 may contain a substrate made of AlN, and a buffer layer made of undoped AlGaN. In this case, the substrate made of AlN may have a side face (or inclined face) that inclines at the third angle θ3, and the buffer layer made of AlGaN may have a side face (or inclined face) that inclines at the first angle θ1. In an embodiment, a side face that inclines at the third angle θ3 may be provided to a sapphire substrate.

The present invention has been explained referring to the embodiments. Those skilled in the art will understand that the present invention is not limited to the aforementioned embodiments, instead allowing various design changes and various modified examples, and that also such modifications are within the scope of the present invention.

Some aspects of the present invention will be explained below.

A first mode of the present invention relates to a semiconductor light-emitting element including: an n-type semiconductor layer, arranged on a base layer, and is made of an n-type AlGaN-based semiconductor material; an active layer arranged on the n-type semiconductor layer, and is made of an AlGaN-based semiconductor material; a p-type semiconductor layer arranged on the active layer; a p-side contact electrode that contacts the top face of the p-type semiconductor layer; a dielectric protective layer that covers the p-side contact electrode, contacts the top face of the p-type semiconductor layer, and is made of $SiO_2$; and a dielectric cover layer that contacts the individual side faces of the active layer and the p-type semiconductor layer, contacts the top face of the p-type semiconductor layer, covers the dielectric protective layer, and is made of $Al_2O_3$. According to the first aspect, since the dielectric cover layer in contact with the side faces of the active layer and the p-type semiconductor layer is made of $Al_2O_3$, so that Si is prevented from diffusing into the active layer and the p-type semiconductor layer. Also with the p-side contact electrode covered with the dielectric protective layer made of $SiO_2$, and with the dielectric protective layer covered with the dielectric cover layer, the first aspect can more suitably protect the p-side contact electrode. Moreover, with the dielectric cover layer arranged so as to contact with the top face of the p-type semiconductor layer, the first aspect can reduce the area where the top face of the p-type semiconductor layer comes into contact with the dielectric protective layer, thus suppressing Si from diffusing into the p-type semiconductor layer.

A second aspect of the present invention relates to the semiconductor light-emitting element described in the first aspect, wherein a first area where the top face of the p-type semiconductor layer and the dielectric protective layer are kept in contact, is smaller than a second area where the top face of the p-type semiconductor layer and the dielectric cover layer are kept in contact. The second aspect can further reduce the area where the top face of the p-type semiconductor layer comes into contact with the dielectric protective layer, thus more suitably suppressing Si from diffusing into the p-type semiconductor layer.

A third aspect of the present invention relates to a method for manufacturing a semiconductor light-emitting element, the method including: sequentially forming, on a base layer, an n-type semiconductor layer made of an n-type AlGaN-based semiconductor material, an active layer made of an AlGaN-based semiconductor material, and a p-type semiconductor layer; partially removing the active layer and the p-type semiconductor layer, to expose the n-type semiconductor layer; forming a p-side contact electrode in contact with a top face of the p-type semiconductor layer; forming a dielectric protective layer made of $SiO_2$, so as to cover the p-side contact electrode, in contact with a top face of the p-type semiconductor layer, and in contact with the individual side faces of the active layer and the p-type semiconductor layer; forming, on the dielectric protective layer, a mask in a region that entirely overlaps the p-side contact electrode; removing, by wet etching, the dielectric protective layer in a region not overlapped with the mask, to expose the individual side faces of the active layer and the p-type semiconductor layer; and forming a dielectric cover layer made of $Al_2O_3$, so as to cover the dielectric protective layer, and in contact with the individual side faces of the active layer and the p-type semiconductor layer. With the dielectric protective layer made of $SiO_2$ once formed entirely over the element and then removed in the unnecessary area, the third aspect can improve quality of the dielectric protective layer. Also with the dielectric protective layer made of $SiO_2$ removed by wet etching, the third aspect can more exactly remove the unnecessary area of the dielectric protective layer, while suppressing possible damages on the side faces of the n-type semiconductor layer, the active layer, and the p-type semiconductor layer. Moreover, since the dielectric cover layer, in contact with the side faces of the active layer and the p-type semiconductor layer, is made of $Al_2O_3$, so that Si is prevented from diffusing into the active layer and the p-type semiconductor layer.

A fourth aspect of the present invention relates to the method for manufacturing a semiconductor light-emitting element described in the third aspect, wherein the dielectric protective layer is removed so as to expose a part of the top face of the p-type semiconductor layer, and the dielectric cover layer is formed so as to contact with the top face of the p-type semiconductor layer. With the dielectric protective layer made of $SiO_2$ removed so as to expose the top face of the p-type semiconductor layer, and with the dielectric cover layer made of $Al_2O_3$ so as to contact with the top face of the p-type semiconductor layer, the fourth aspect can further reduce the area where the top face of the p-type semiconductor layer comes into contact with the dielectric protective layer. This can suppress Si from diffusing into the p-type semiconductor layer.

A fifth aspect of the present invention relates to the method for manufacturing a semiconductor light-emitting element described in the third aspect or the fourth aspect, the method further including: removing, by dry etching, the dielectric protective layer and the dielectric cover layer on the p-side contact electrode, to form a contact opening; and forming, in the contact opening, a p-side current diffusion layer so as to contact with the p-side contact electrode. According to the fifth aspect, since the dielectric protective layer and the dielectric cover layer, which are made of different materials, may be removed successively by dry etching, so that the number of steps for forming the contact opening may be reduced.

What is claimed is:

1. A method for manufacturing a semiconductor light-emitting element, comprising:
    forming an n-type semiconductor layer made of an n-type AlGaN-based semiconductor material, an active layer made of an AlGaN-based semiconductor material, and a p-type semiconductor layer, on a base layer sequentially;
    removing the active layer and the p-type semiconductor layer partially, to expose the n-type semiconductor layer;
    forming a p-side contact electrode in contact with a top face of the p-type semiconductor layer;
    forming a dielectric protective layer made of $SiO_2$, so as to cover the p-side contact electrode, in contact with the top face of the p-type semiconductor layer, and in contact with individual side faces of the active layer and the p-type semiconductor layer;
    forming, on the dielectric protective layer, a mask in a region that entirely overlaps the p-side contact electrode;
    removing the dielectric protective layer in a region not overlapped with the mask, to expose the individual side faces of the active layer and the p-type semiconductor layer, and to expose a part of the top face of the p-type semiconductor layer;
    forming a dielectric cover layer made of $Al_2O_3$, so as to cover above the dielectric protective layer, in contact with the individual side faces of the active layer and the p-type semiconductor layer, and in contact with the top face of the p-type semiconductor layer;
    removing, by dry etching, the dielectric protective layer and the dielectric cover layer on the p-side contact electrode, to form a contact opening; and
    forming, in the contact opening, a p-side current diffusion layer so as to contact the p-side contact electrode.

* * * * *